United States Patent [19]
Hashimoto

[11] Patent Number: 6,028,344
[45] Date of Patent: *Feb. 22, 2000

[54] BIPOLAR TRANSISTOR ON A SEMICONDUCTOR-ON-INSULATOR SUBSTRATE

[75] Inventor: Takasuke Hashimoto, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/031,104

[22] Filed: Feb. 26, 1998

[30] Foreign Application Priority Data

Feb. 28, 1997 [JP] Japan .................................... 9-045092

[51] Int. Cl.⁷ .................................................. H01L 23/48
[52] U.S. Cl. ......................... 257/587; 257/588; 257/593; 257/565; 257/517
[58] Field of Search .................................... 257/520, 565, 257/524, 588, 510, 511, 513, 514, 515, 517, 518, 526, 527, 583, 587, 592, 621

[56] References Cited

U.S. PATENT DOCUMENTS

| | | | |
|---|---|---|---|
| 4,404,658 | 9/1983 | Ports | 365/154 |
| 4,663,831 | 5/1987 | Birrittella et al. | 29/576 |
| 4,849,371 | 7/1989 | Hansen et al. | 437/82 |
| 4,875,085 | 10/1989 | Ueno et al. | 357/34 |
| 5,319,239 | 6/1994 | Ning | 257/585 |
| 5,323,055 | 6/1994 | Yamazaki | 257/588 |
| 5,371,401 | 12/1994 | Kurita | 257/524 |
| 5,444,014 | 8/1995 | Ryum et al. | 437/62 |
| 5,475,257 | 12/1995 | Hashimoto et al. | 257/587 |
| 5,598,015 | 1/1997 | Tanoue et al. | 257/197 |
| 5,731,623 | 3/1998 | Ishimaru | 257/517 |
| 5,763,931 | 6/1998 | Suiyama | 257/506 |

FOREIGN PATENT DOCUMENTS

| | | | |
|---|---|---|---|
| 3-203333 | 9/1991 | Japan | H01L 21/331 |
| 4-62847 | 2/1992 | Japan | H01L 21/331 |
| 5-235014 | 9/1993 | Japan | H01L 21/331 |
| 8139180 | 5/1996 | Japan | H01L 21/762 |

*Primary Examiner*—Jerome Jackson, Jr.
*Assistant Examiner*—Bradley William Baumeister
*Attorney, Agent, or Firm*—Hayes Soloway Hennessey Grossman & Hage PC

[57] ABSTRACT

A bipolar transistor formed on a SOI substrate has a buried collector layer underlying an emitter region and a collector contact region for connection thereof, both of which are made of a doped polysilicon film deposited in a removed portion of an oxide film etched by wet etching and a collector contact groove, respectively. By reducing the area of the buried collector layer, the bipolar transistor has excellent frequency characteristics in a high-frequency range.

8 Claims, 5 Drawing Sheets

BIPOLAR TRANSISTOR ON A SEMICONDUCTOR-ON-INSULATOR SUBSTRATE

BACKGROUND OF THE INVENTION (a) Field of the Invention

The present invention relates to a bipolar transistor on a semiconductor-on-insulator substrate and, more particularly, to a structure of a semiconductor-on-insulator substrate, such as a silicon-on-insulator (SOI) substrate, on which a bipolar transistor is formed.

(b) Description of the Related Art

A SOI substrate is increasingly used for its advantages of a low power dissipation and a high speed operation of the resultant semiconductor device. FIGS. 1A to 1C show consecutive steps of a process for fabricating a bipolar transistor on a SOI substrate, which is described in Patent Publication JP-A-8-139180. First, an n$^+$-type polycrystalline silicon (polysilicon) layer 33 is grown on the bottom surface of an n-type single-crystalline silicon substrate 31, and a silicon oxide film 34 is formed thereon, followed by bonding a silicon supporting plate (substrate body) 32 onto the silicon oxide film 34 and polishing the top surface of the silicon substrate 31 to form a SOI substrate, as shown in FIG. 1A.

Subsequently, as shown in FIG. 1B, a plurality of separation grooves 35 are formed at the top surface of the silicon substrate 31 for exposing the top surface of the silicon oxide film 34, thereby separating the SOI substrate into a plurality of cell areas, followed by filling the separation grooves 35 with a silicon oxide film 36 to form separation channels. Then another groove (collector contact groove) 37 is formed in the silicon substrate 31 in each cell area, and the collector contact groove 37 is filled with a polysilicon film 38.

Subsequently, as shown in FIG. 1C, the polysilicon film 38 in the collector contact groove 37 is doped with phosphorous (P) by ion-implantation using a mask, followed by thermal diffusion thereof from the polysilicon film 38 to the polysilicon layer 33 to form an n$^+$-type collector contact region 38a and an n$^+$-type buried collector layer 33a. Thereafter, boron (B) is introduced to the silicon substrate 31 by selective ion-implantation to form a p-type base region 39, followed by introduction of arsenic (As) into a portion of the base region 39 to form an emitter region 40 in the base region 39. After forming a silicon oxide film 41 having openings on the emitter region 39 and the base region 40, a collector electrode 42, an emitter electrode 43 and a base electrode 44 are formed on the respective regions.

With the technique as described above, it is possible to reduce the horizontal distance between the collector and the base so as to reduce the dimensions of the bipolar transistor compared to a conventional technique wherein the collector contact region is formed by direct introduction of impurity ions from the surface of a silicon substrate without forming a groove to a depth reaching the buried contact layer which is formed beforehand in the cell area as one of a plurality of epitaxial layers.

In addition, since the polysilicon layer 33 is formed as underlying the silicon substrate 31 in the above technique, the buried collector layer 33a can be selectively formed as either p-type or n-type depending on the selection of the impurities after the SOI substrate is prepared. This means that the SOI substrate can be manufactured before the layout of the semiconductor device is designed, thereby reducing the turn-around-time (TAT) of the semiconductor device.

Further, it has the advantage in that a plurality of epitaxial steps are not needed in the fabrication of the SOI substrate, which enables cost reduction in the fabrication process thereof.

In order to improve the frequency characteristics in a high-frequency range, it is generally requested to have a lower parasitic capacitance between the collector and the base of the bipolar transistor. In the structure fabricated by the process as described above, however, there is a problem in that the parasitic capacitance between the buried collector layer and the base region in the silicon substrate is relatively large.

SUMMARY OF THE INVENTION

It is therefore an object of the present invention to improve the conventional semiconductor device implemented on a SOI structure as described above, to thereby provide a new structure of a semiconductor device implemented on a SOI substrate and having excellent frequency characteristics in a high-frequency range.

The present invention provides a semiconductor device comprising a composite semiconductor substrate and a bipolar transistor formed on the composite semiconductor substrate, the composite semiconductor substrate including a substrate body and a first insulator film, a second insulator film and a single crystalline semiconductor layer consecutively arranged on the substrate body, the second insulator having a removed portion therein. The bipolar transistor has an emitter region and a base region formed in the semiconductor layer and a buried collector layer formed in the removed portion of the second insulator layer.

In accordance with the present invention, since the buried collector layer is disposed in the removed portion of the second insulator film under the base region, the occupied area of the buried collector layer which may be disposed only just under the emitter region can be reduced, with the other area being occupied by the remaining portion of the second insulator layer. Accordingly, the parasitic capacitance between the base and the collector of the bipolar transistor can be reduced, which enables an improvement in the frequency characteristics of the bipolar transistor in a high-frequency range.

The above and other objects, features and advantages of the present invention will be more apparent from the following description, referring to the accompanying drawings.

PREFERRED EMBODIMENT OF THE INVENTION

Figure 1A:
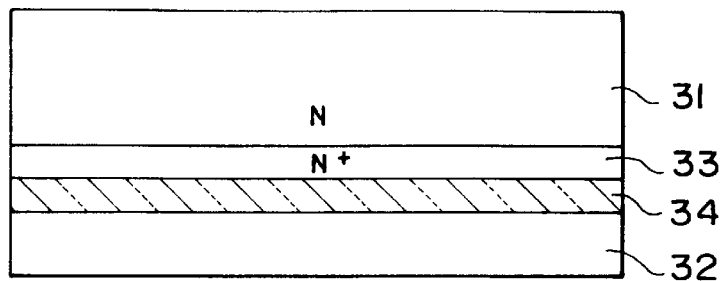
FIGS. 1A to 1C are cross-sectional views of a conventional semiconductor device in consecutive steps of fabrication process therefor.

Now, the present invention is more specifically described with reference to accompanying drawings, wherein similar constituent elements are designated by similar reference numerals.

Figure 2:
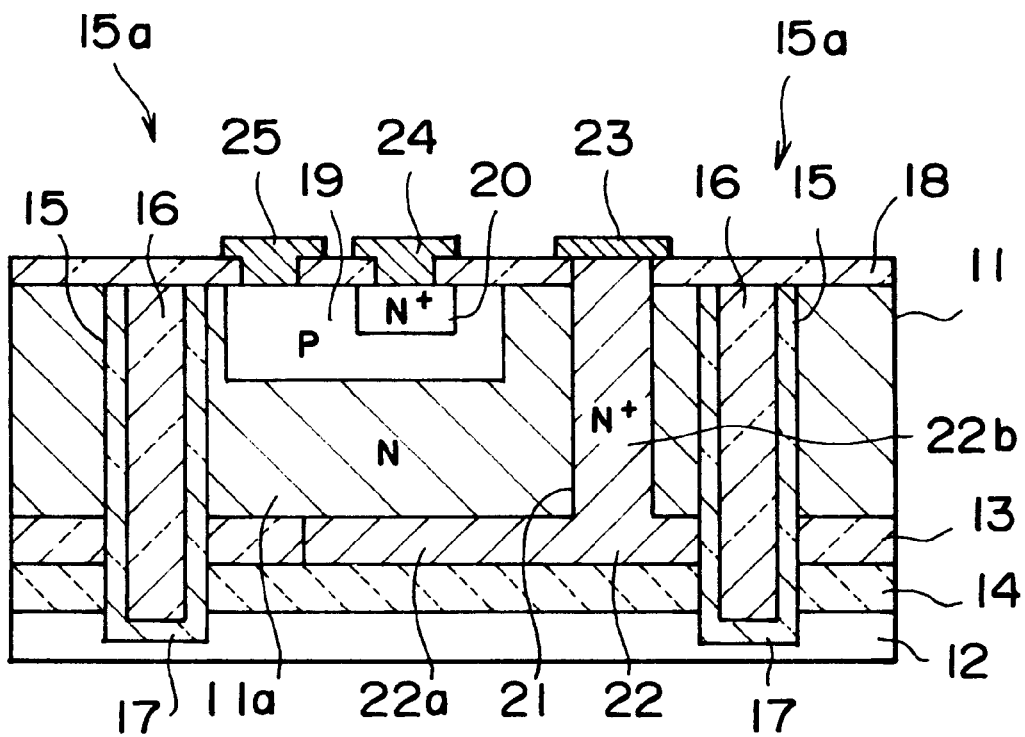
FIG. 2 is a cross-sectional view of a semiconductor device according to a first embodiment of the present invention.

Referring to FIG. 2, a semiconductor device according to a first embodiment of the present invention is formed on a composite semiconductor substrate, or a SOI substrate, having a single crystalline silicon layer (silicon substrate) 11, a silicon supporting plate (substrate body) 12, and a two-layer insulating film sandwiched between the silicon substrate 11 and the silicon supporting plate 12. The two-layer insulating film includes a silicon oxide film 13 adjacent to the silicon substrate 11 and a silicon nitride film 14 adjacent to the silicon supporting plate 12.

A plurality of separation channels 15 separate the SOI substrate into a plurality of cell areas. The separation channel 15 is implemented by a groove formed in the SOI substrate and having an open top at the top surface of the silicon substrate 11 and a closed bottom below the top surface of the silicon substrate body 12, and a two-layer film including a silicon nitride film 17 and a silicon oxide film 16 consecutively formed in the groove and filling the same.

The semiconductor device has an n-p-n bipolar transistor in each cell area. The collector of the bipolar transistor is composed of a n-type portion of the silicon substrate 11, an n$^+$-type buried collector layer 22a underlying the n-type portion 11a of the silicon substrate 11 and formed by replacing a portion of the silicon oxide film 13 with a doped polysilicon film, and an n$^+$-type collector contact region 22b having a top flush with the top surface of a silicon nitride film 18 formed on the silicon substrate 11 and a bottom in contact with the buried collector layer 22a. The bipolar transistor further comprises a p-type base region 19 doped with p-type impurities within a remaining portion of the silicon substrate 11 in the cell area, and an n$^+$-type emitter region 20 doped with n-type impurities within the p-type base region 19. The silicon nitride film 18 is formed on the silicon substrate 11 and has therein openings for receiving a collector electrode 23, an emitter electrode 24 and a base electrode 25 for respective regions.

Figure 1B:
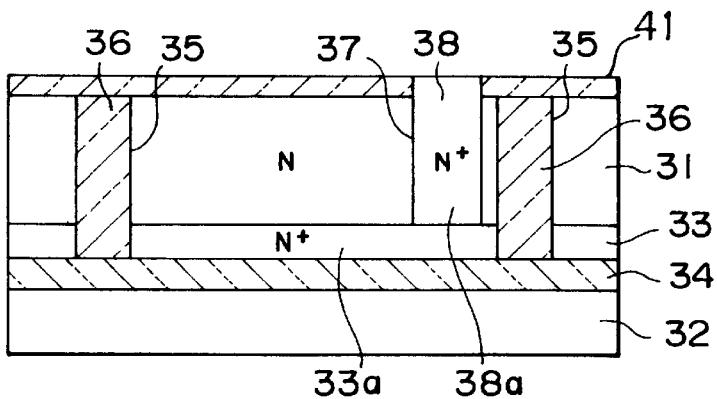
Figure 1C:
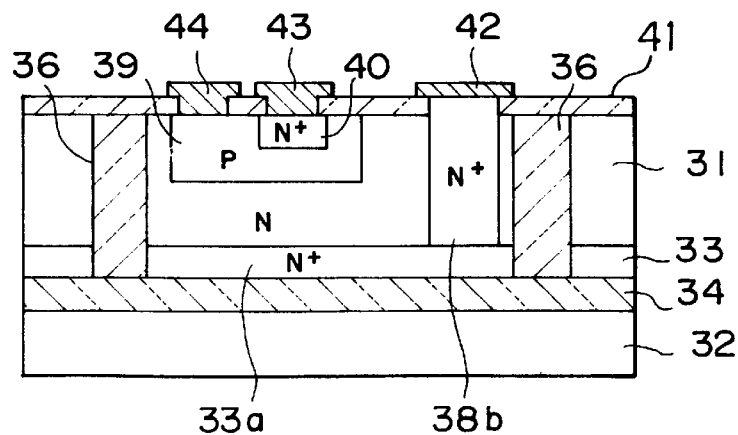

The buried collector layer 22a of the bipolar transistor extends from the bottom of the collector contact region 22b to the area underlying a portion of the base region 19 just under the emitter region 20, with the silicon oxide layer 13 being underlying the remaining portion of the base region 19 deviated from the emitter region 20. This configuration enables reduction of the parasitic capacitance between the collector and the base of the bipolar transistor compared to the conventional technique of FIGS. 1A to 1C by, for example, 15%, to obtain excellent frequency characteristics in a high-frequency range.

Figure 3A:
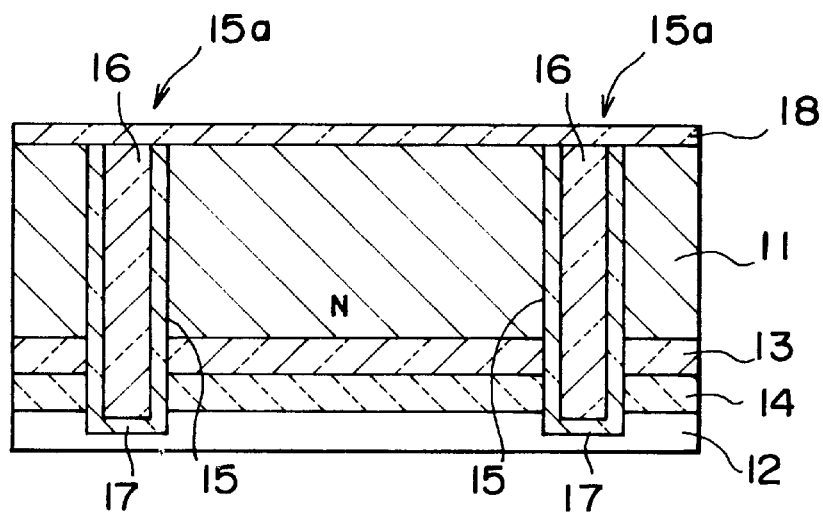
FIGS. 3A to 3D are cross-sectional views of the semiconductor device of FIG. 2 in consecutive steps of fabrication process therefor.

FIGS. 3A to 3D show consecutive steps of fabrication process for the semiconductor device of FIG. 2. First, as shown in FIG. 3A, a silicon oxide film 13 and a silicon nitride film 14 are consecutively formed on the bottom surface of an n-type silicon substrate 11 having a single crystalline structure. A silicon supporting plate 12 is then bonded onto the silicon nitride film 14, followed by polishing the top surface of the silicon substrate 11 to form a SOI substrate or semiconductor composite substrate.

A plurality of separation grooves 15 are formed on the SOI substrate by a selective etching technique at the top surface of the silicon substrate 11 so that the bottom of the separation grooves 15 reaches inside the silicon substrate body 12. Over the entire top surface of the silicon substrate 11 including the inner wall of the separation grooves 15, a thin silicon nitride film 17 and a thick silicon oxide film 16 are consecutively grown and deposited, followed by etch-back thereof, thereby forming a plurality of separation channels 15a for separation of the SOI substrate into a plurality of cell areas. Thereafter, a silicon nitride film 18 is formed over the entire top surface of the SOI substrate to obtain the structure of FIG. 3A.

Figure 3B:
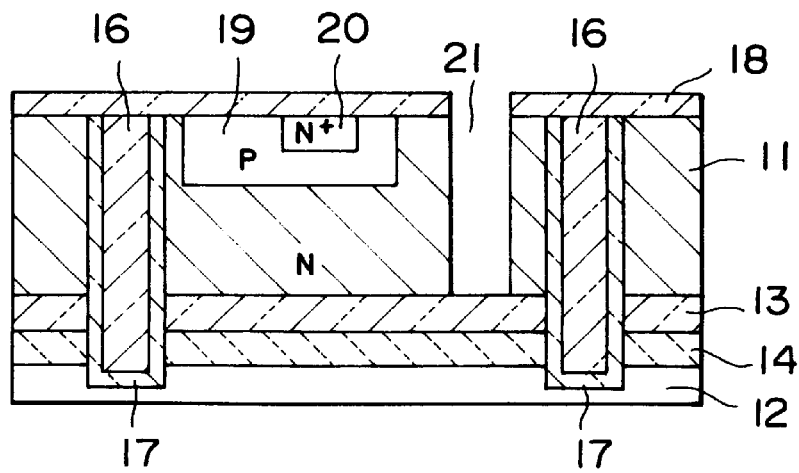

Subsequently, as shown in FIG. 3B, a surface portion of the silicon substrate 11 in each cell area is doped with boron by selective ion-implantation to define a p-type base region 19 within the cell area, followed by doping a surface portion of the base region 19 with arsenic by selective ion-implantation to define an n-type emitter region 20 within the base region 19. Another groove (collector contact groove) 21 is then formed in each cell area from the top surface of the silicon nitride film 18 to the top surface of the silicon oxide film 13 by an anisotropic etching technique.

Figure 3C:
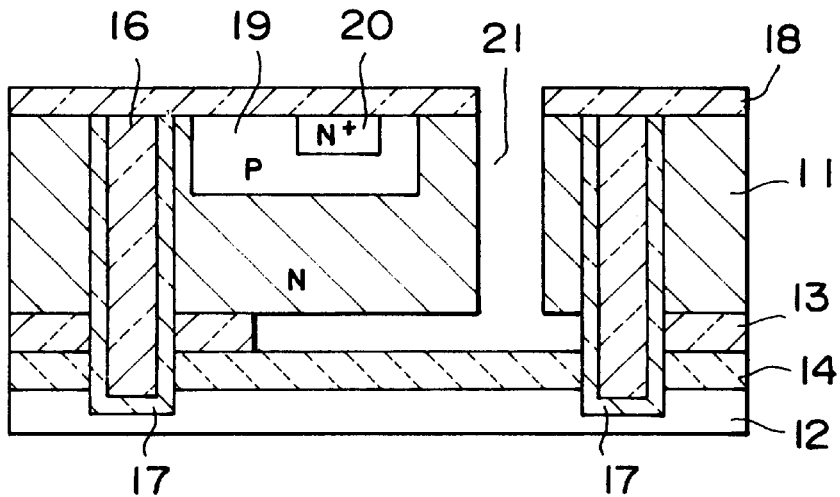

Subsequently, as shown in FIG. 3C, a wet etching process using hydrofluoric acid is conducted through the collector contact groove 21 to remove a portion of the silicon oxide film 13 in an area between the bottom of the collector contact groove 13 and the region just underlying the emitter region 20. Although the etching of the silicon oxide film 13 proceeds in the direction opposite to the desired direction, the undesired etching is stopped by the silicon nitride film 17 formed in the separation channel 15a, as shown in FIG. 3C.

Figure 3D:
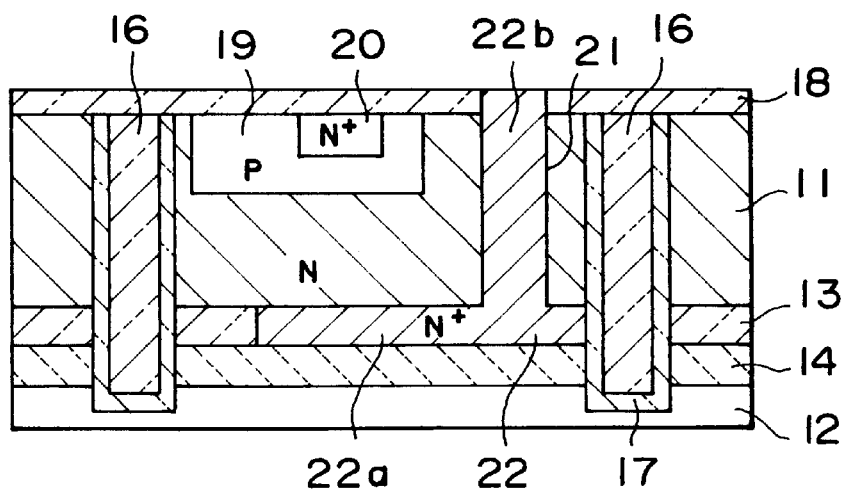

Subsequently, as shown in FIG. 3D, doped polysilicon 22 doped with phosphorous is deposited in the removed region of the silicon oxide film 13 and also in the collector contact groove 21 by using a selective silicon growth technique. As a result, a buried collector layer 22a and a collector contact region 22b both made of doped polysilicon 22 formed in the removed region of the silicon oxide film 13 and the collector contact groove 21, respectively.

Subsequently, as shown in FIG. 2, openings are formed in the silicon nitride film 18 for exposing respective portions of the base region 19 and the emitter region 20, followed by sputtering aluminum therein to a thickness of 2 μm and patterning thereof to form a collector electrode 23, an emitter electrode 24 and a base electrode 25.

The fabrication process as described above allows formation of the structure of FIG. 2 by the wet etching step after formation of the collector contact groove 21 without a photolithographic step, which might be used for fabrication of the structure of the buried collector layer 22a during fabrication of a SOI substrate in a conventional technique. Thus, the fabrication process as described above does not complicate the fabrication process for the SOI substrate due to the structure of FIG. 2.

Figure 4:
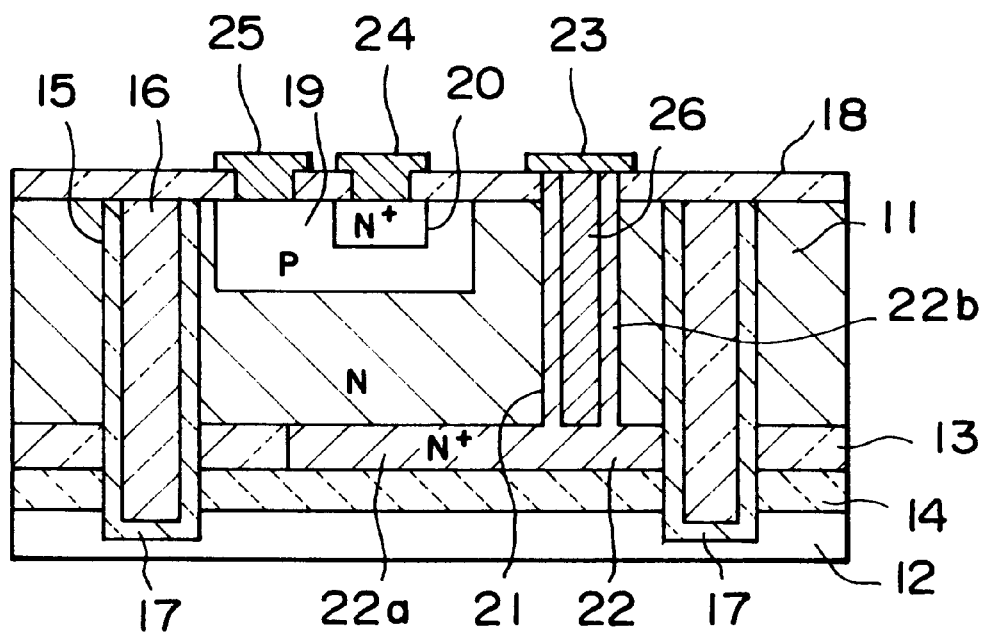
FIG. 4 is a cross-sectional view of a semiconductor device according to a second embodiment of the present invention.

Referring to FIG. 4, a semiconductor device according to a second embodiment of the present invention is similar to the first embodiment except that the collector contact region comprises a tungsten plug 26 disposed in a cylindrical-shaped doped polysilicon 22b. The doped polysilicon 22 including the buried collector layer 22a and the cylindrical portion 22b of the collector contact region are formed by a process similar to the process for fabricating the first embodiment and an additional step. In this structure, the collector contact region in the second embodiment has a lower resistance compared to the first embodiment by about 20%.

In the fabrication process for the second embodiment, after the doped polysilicon film 22 is deposited in the removed region of the silicon oxide film 13 and the collector contact groove 21 in a step similar to the step in the first embodiment, the doped polysilicon 22 in the collector contact groove 21 is selectively etched by an anisotropic etching technique to leave the cylindrical-shaped doped polysilicon 22b. The removed portion of the doped polysilicon 22b is then filled with the tungsten plug 26. The tungsten plug 26 may be replaced by a molybdenum or copper plug.

In the first and the second embodiment, the buried collector layer 22*a* is disposed only at the position just under the emitter region 20. This reduces the parasitic capacitance between the base and the collector of the bipolar transistor to allow the bipolar transistor to operate at a high speed. The buried collector layer 22*a* can be formed without using a photolithographic step in the fabrication process of the SOI substrate and the succeeding process, and accordingly, it does not substantially complicate the fabrication process for the bipolar transistor.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a composite semiconductor substrate and a bipolar transistor formed in said composite semiconductor substrate, said composite semiconductor substrate including a substrate body and a first insulator film, a second insulator film and a single crystalline semiconductor layer consecutively disposed on said substrate body, said bipolar transistor having an emitter region, a base region and a collector formed in said semiconductor layer, said collector region and said base region being separated by said semiconductor layer, and a buried collector layer extending from the bottom of said collector to an area underlying said emitter region and extending short of the area underlying said base region, said buried collector layer being formed in a partially removed portion of said second insulator layer, wherein a remaining portion underlyes said base portion.

2. A semiconductor device as defined in claim 1, wherein said collector region comprises a collector contact region formed in said semiconductor layer and having a bottom in contact with said buried collector layer.

3. A semiconductor device as defined in claim 2, wherein said buried collector layer and said collector contact region are made of doped polycrystalline silicon.

4. A semiconductor device as defined in claim 2, wherein said collector contact region comprises a metal.

5. A semiconductor device as defined in claim 1, wherein said first insulator layer is made of silicon nitride and said second insulator layer is made of silicon oxide.

6. A semiconductor device as defined in claim 1, wherein said semiconductor layer is made of single crystalline silicon.

7. A semiconductor device as defined in claim 1, wherein said substrate body is made of silicon.

8. A semiconductor device as defined in claim 1, wherein said buried collector layer is formed adjacent to said remaining portion of said second insulator layer.

* * * * *